(12) United States Patent
Czompo (10) Patent No.: US 8,271,235 B2
(45) Date of Patent: Sep. 18, 2012

(54) EFFICIENT CONCURRENT SAMPLING AT DIFFERENT RATES

(75) Inventor: Joseph Czompo, San Jose, CA (US)

(73) Assignee: Qualcomm Incorporated, San Diego, CA (US)

( * ) Notice: Subject to any disclaimer, the term of this patent is extended or adjusted under 35 U.S.C. 154(b) by 359 days.

(21) Appl. No.: 12/750,109

(22) Filed: Mar. 30, 2010

(65) Prior Publication Data

US 2011/0244810 A1    Oct. 6, 2011

(51) Int. Cl.
*G06F 15/00*    (2006.01)
*G06F 9/00*    (2006.01)

(52) U.S. Cl. .................. 702/189; 341/122; 702/190

(58) Field of Classification Search .............. 702/104, 702/189, 190; 73/660; 341/122, 123, 143, 341/144; 455/73; 700/94
See application file for complete search history.

(56) References Cited

U.S. PATENT DOCUMENTS

| | | | |
|---|---|---|---|
| 5,157,394 A | 10/1992 | Bright | |
| 5,521,839 A | 5/1996 | Doolittle et al. | |
| 5,815,101 A | 9/1998 | Fonte | |
| 5,930,745 A * | 7/1999 | Swift | 702/190 |
| 5,965,819 A | 10/1999 | Piety et al. | |
| 6,728,584 B1 | 4/2004 | Duan et al. | |
| 7,525,466 B2 | 4/2009 | Vanderhaegen et al. | |
| 2009/0306936 A1 | 12/2009 | Kawabata et al. | |

FOREIGN PATENT DOCUMENTS

EP    0871036 A2    10/1998

OTHER PUBLICATIONS

International Search Report and Written Opinion—PCT/US2011/030395, ISA/EPO—Jun. 24, 2011.

\* cited by examiner

*Primary Examiner* — John H Le (57) ABSTRACT

An apparatus and method for efficient and concurrent sampling of a sensor signal to create multiple output signals each at different sampling rates is provided. The apparatus and method determine an aperiodic sampling rate or sampling schedule such that only samples representing samples at the different sampling rates are taken. The aperiodic samples are taken then de-interleaved to filter wanted samples for a particular application or user. As a result, the aperiodic samples is just a combination of all of the subsets to each application. Such aperiodic sampling reduces a total number of samples taken and, as a direct result, reduces the number of samples needing to be processed and stored and also reduced the power otherwise consumed to sample, process and store unused samples.

18 Claims, 7 Drawing Sheets

EFFICIENT CONCURRENT SAMPLING AT DIFFERENT RATES

RELATED APPLICATIONS

Not applicable.

FIELD

This disclosure relates generally to apparatus and methods for aperiodically sampling sensor data in a wireless device. More particularly, the disclosure relates to providing periodic samples to applications requiring different sampling rates from an aperiodic sampled source.

BACKGROUND

A single mobile device may allow multiple applications to execute simultaneously. Several applications requiring sensor data often run concurrently within a user's mobile device. Two or more of these applications may need sensor measurements from a common type of sensor or the same sensor. Often the requirements for sensor data from separate applications vary. That is, one application may require samples from a sensor at a first periodic sampling rate while a second application requires data from the same sensor but at a second periodic sampling rate.

Typically, applications require sensor measurements at a periodic rate but a first application may need sensor measurements often while a second application may use measurements from the same sensor less frequently. For example, a first application may require measurement every 20 milliseconds (ms) (equivalent to a sampling rate of 50 Hz) and a second application may require measurements every 25 ms (equivalent to a sampling rate of 40 Hz).

Several approaches are available to accommodate different sampling rates. In a first approach, a mobile device may provide a corresponding number of sensors, each with its own sampler. That is, if there are N applications requiring sensor measurements, there are a corresponding N or more sensors. This approach requires a number of duplicative sensors and samplers, each consuming power and requiring circuit board real estate.

A second approach includes a single sensor but a plural number of samplers. This single-sensor approach has the advantage of saving some power but disadvantages associated with having of multiple samplers.

A third approach includes a single sensor with a single sampler. With this approach, a higher over-sampled sampling rate is used such that each of the various required sampling rates are found within the over-sampled sampling rate. That is, a periodic sampling rate is selected based on the least common multiple (LCM) of the different sampling rates, which typically results in a high LCM sampling rate and a large number of unused samples. The over-sampled sampling rate is the smallest number that is a multiple of each of the required sampling rates. For example, the LCM of 50 Hz (sampling rate of first application) and 40 Hz (sampling rate of first application) is 200 Hz (sampling rate of sampler). In this case, the sampler provides samples at a rate four times what is necessary for the first application and five times what is necessary for the second application.

Of the several approaches available, each having its various drawbacks in extra hardware requirements, power consumption and time necessary to process unused samples.

SUMMARY OF THE DISCLOSURE

An apparatus and method for efficient and concurrent sampling of a sensor signal to create multiple output signals each at different sampling rates are provided.

Embodiments determine an aperiodic sampling rate or sampling schedule such that only samples representing samples at the different sampling rates are taken. The aperiodic samples are taken then de-interleaved to filter out wanted samples for a particular application or user. For example, a first subset of the aperiodic samples are routed to a first application at a first periodic sampling rate, and a second overlapping subset of the aperiodic samples are routed to a second application at a different second periodic sampling rate. As a result, the aperiodic samples are just a combination of all of the subsets. Typically, such aperiodic sampling reduces a total number of samples taken and, as a direct result, reduces the number of samples needing to be processed and stored and also reduced the power otherwise consumed to sample, process and store unused samples.

According to some aspects, disclosed is a method of providing a sensor signal to multiple applications in a mobile device, each requiring a different sampling rate, the method comprising: sampling the sensor signal at an aperiodic sampling rate resulting in aperiodic samples; and de-interleaving the aperiodic samples comprising routing to a first application a first subset of the aperiodic samples, wherein the first subset represents samples at a first periodic sampling rate; and routing to a second application a second subset of the aperiodic samples, wherein the second subset represents samples at a second periodic sampling rate, and wherein the first periodic sample rate differs from the second periodic sampling rate.

According to some aspects, disclosed is a mobile device for providing a sensor signal to multiple applications in a mobile device, each requiring a different sampling rate, the device comprising: a sampler comprising an input port to couple to the sensor signal, a control port to couple to an aperiodic trigger based on an aperiodic sampling rate, and an output port to provide aperiodic samples at the aperiodic sampling rate; and a de-interleaver comprising an input port to couple to the aperiodic samples, a first output port to route to a first application a first subset of the aperiodic samples at a first periodic sampling rate, and a second output port to route to a second application a second subset of the aperiodic samples at a second periodic sampling rate; wherein the first and second periodic sample rates are different.

According to some aspects, disclosed is a mobile device for providing a sensor signal to multiple applications in the mobile device, each requiring a different sampling rate, the device comprising: means for sampling the sensor signal at an aperiodic sampling rate resulting in aperiodic samples; and means for de-interleaving the aperiodic samples comprising means for routing a first application a first subset of the aperiodic samples, wherein the first subset represents samples at a first periodic sampling rate; and means for routing a second application a second subset of the aperiodic samples, wherein the second subset represents samples at a second periodic sampling rate, wherein the first periodic sample rate differs from the second periodic sampling rate.

According to some aspects, disclosed is a mobile device for providing a sensor signal to multiple applications in the mobile device, each requiring a different sampling rate, the device comprising a processor and a memory wherein the memory includes software instructions to: instruct a sampler to sample the sensor signal at an aperiodic sampling rate resulting in aperiodic samples; and de-interleave the aperiodic samples comprising software instructions to route a first application a first subset of the aperiodic samples, wherein the first subset represents samples at a first periodic sampling rate; and route a second application a second subset of the aperiodic samples, wherein the second subset represents samples at a second periodic sampling rate, wherein the first periodic sample rate differs from the second periodic sampling rate.

According to some aspects, disclosed is a computer-readable medium including program code stored thereon, comprising program code to: instruct a sampler to sample the sensor signal at an aperiodic sampling rate resulting in aperiodic samples; and de-interleave the aperiodic samples comprising program code to route a first application a first subset of the aperiodic samples, wherein the first subset represents samples at a first periodic sampling rate; and route a second application a second subset of the aperiodic samples, wherein the second subset represents samples at a second periodic sampling rate, wherein the first periodic sample rate differs from the second periodic sampling rate.

It is understood that other aspects will become readily apparent to those skilled in the art from the following detailed description, wherein it is shown and described various aspects by way of illustration. The drawings and detailed description are to be regarded as illustrative in nature and not as restrictive.

DETAILED DESCRIPTION

The detailed description set forth below in connection with the appended drawings is intended as a description of various aspects of the present disclosure and is not intended to represent the only aspects in which the present disclosure may be practiced. Each aspect described in this disclosure is provided merely as an example or illustration of the present disclosure, and should not necessarily be construed as preferred or advantageous over other aspects. The detailed description includes specific details for the purpose of providing a thorough understanding of the present disclosure. However, it will be apparent to those skilled in the art that the present disclosure may be practiced without these specific details. In some instances, well-known structures and devices are shown in block diagram form in order to avoid obscuring the concepts of the present disclosure. Acronyms and other descriptive terminology may be used merely for convenience and clarity and are not intended to limit the scope of the disclosure.

With each of the approaches describe above, one or more samplers each having a periodic sampling rate. In accordance to embodiments of the present invention, however, a single sampler is used and has an aperiodic sampling rate is used.

Figure 1:
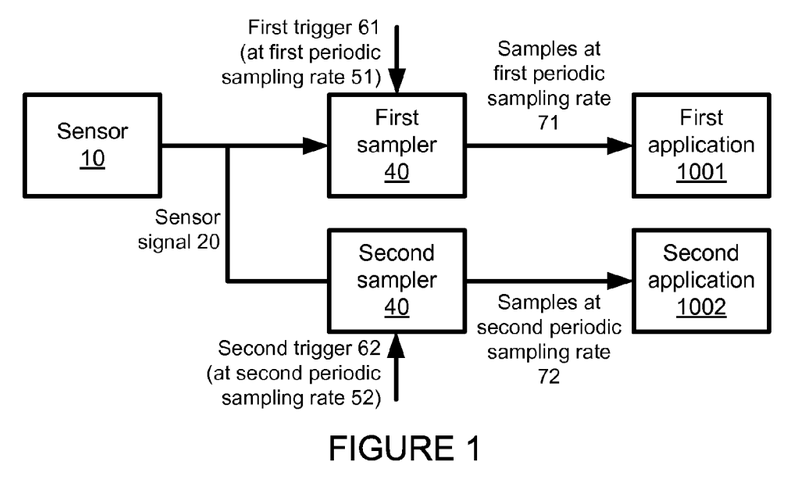
FIG. 1 shows two applications receiving samples from a common sensor via separate samplers.

FIG. 1 shows two applications receiving samples from a common sensor via separate samplers. According to the second approach described above, one sensor 10 is connected to two samplers 40. The sensor 10 provides a common sensor signal 20 to both samplers 40, which in turn provides corresponding samples 71, 72 to applications 1001, 1002. A first sampler 40 receives a first trigger 61. The first trigger 61 carries a first periodic sampling rate 51 (e.g., 50 Hz). The first sampler 40 provides resulting samples 71 at the first periodic sampling rate 51 to a first application 1001. Similarly, a second sampler 40 receives a second trigger 62. The second trigger 62 carries a second periodic sampling rate 52 (e.g., 40 Hz). The second sampler 40 provides resulting samples 72 at the second periodic sampling 52 rate to a second application 1002. Again, this approach has the disadvantage of multiple samplers, on for each application requiring sensor samples from a common sensor. Also, sampling requests from multiple samplers may collide at the sensor, thus the sensor may not be able to receive each sampling command.

Figure 2:
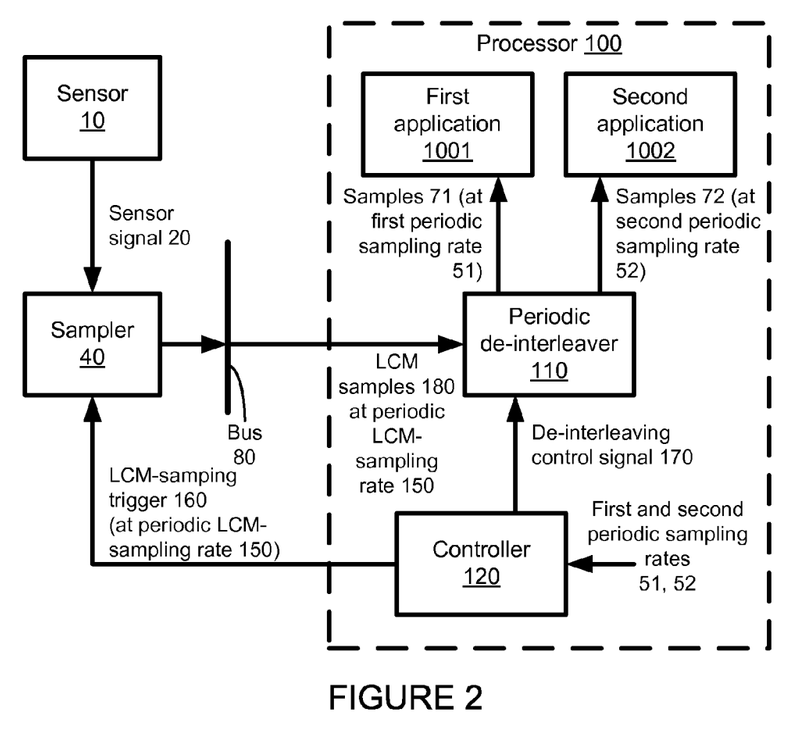
FIG. 2 shows a mobile device, which oversamples a sensor signal at a high periodic rate in order to effectively provide samples at two lower sampling rates.

FIG. 2 shows a mobile device, which oversamples a sensor signal at a high periodic rate in order to effectively provide samples at two lower sampling rates. Instead of two separate samples, a single sampler 40 accepts a sensor signal 20 from a sensor 10. The sampler is triggered by a triggering signal (LCM-sampling trigger 160), which operates at a periodic sampling rate (periodic LCM-sampling rate 150) and provides LCM samples 180 at a periodic over-sampled sample rate (LCM-sampling rate 180). This LCM-sampled rate 150 is set to the least common multiple (LCM) of two or more different periodic sampling rates required by a corresponding two or more different applications.

The LCM-sampling rate 150 is higher than the data rates required by the applications. In a typical architecture, the LCM samples 180 pass from the sampler 40 to a periodic de-interleaver 110 via a bus 80. At the higher LCM-sampling rate 150, bus transitions require significantly more power than would be required at one of the sample rates required by one of the applications. The periodic de-interleaver 110 acts as a multiplexer or switch to provide the various application only the samples that each needs and discards the remaining samples. In the case shown, the periodic de-interleaver 110 accepts the LCM samples 180 arriving at the periodic LCM-sampling rate, diverts samples 71 at a first sampling rate required by a first application 1001, diverts samples 72 at a second sampling rate required by a second application 1002, and discards the remaining unwanted samples. Therefore, depending on timing, each particular sample from the LCM samples 180 will be: (1) forwarded to just a single application; (2) forwarded to two or more applications; or (3) discarded and not provided to any application. A controller 120 generates the LCM-sampling trigger 160 based on the periodic LCM-sampling rate 150, which is in turn based on the first and second periodic sampling rates 51, 52. The control 120 may also provide a de-interleaving control signal 170 to be used by the periodic de-interleaver 110 to route or parse the incoming LCM samples 180. The periodic de-interleaver 110 and controller 120, as well as the first and second applications 1001, 1002, may each execute as routines on a processor 100. Alternatively, the periodic de-interleaver 110 and controller 120 may be implemented in hardware or as a combination of hardware and software.

Figure 3A:
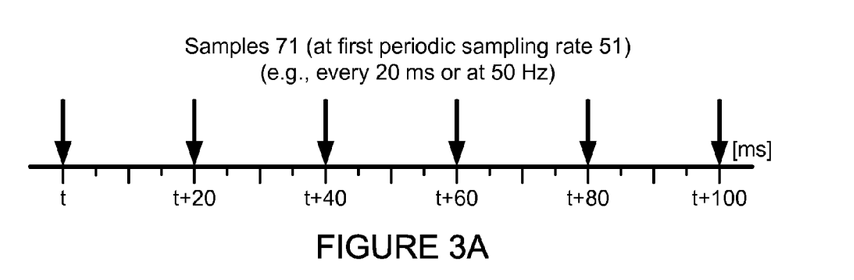
FIGS. 3A and 3B show an example of a first periodic schedule for sampling a sensor signal at a first periodic sampling rate and a second periodic schedule for sampling a sensor signal at a second periodic sampling rate.
Figure 3B:
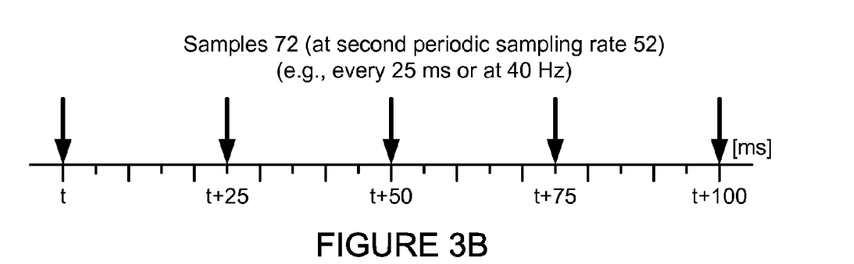

FIGS. 3A and 3B show an example of a first periodic schedule for sampling a sensor signal at a first periodic sampling rate and a second periodic schedule for sampling a sensor signal at a second periodic sampling rate. FIG. 3A shows timing for samples 71 used in a first application 1001 requiring at a first periodic sampling rate 51 (e.g., every 20 ms at times {t, t+20, t+40, t+60, t+80, t+100, . . . } or at a rate of 50 Hz) beginning at a time t. FIG. 3B shows timing for samples 72 used in a second application 1002 requiring at a second periodic sampling rate 52 (e.g., every 25 ms at times {t, t+25, t+50, t+75, t+100, . . . } or at a rate of 40 Hz) beginning at the time t. In this example, samples 71 and 72 for the first and second applications have common samples at time {t, t+100, t+200, . . . }.

Figure 4A:
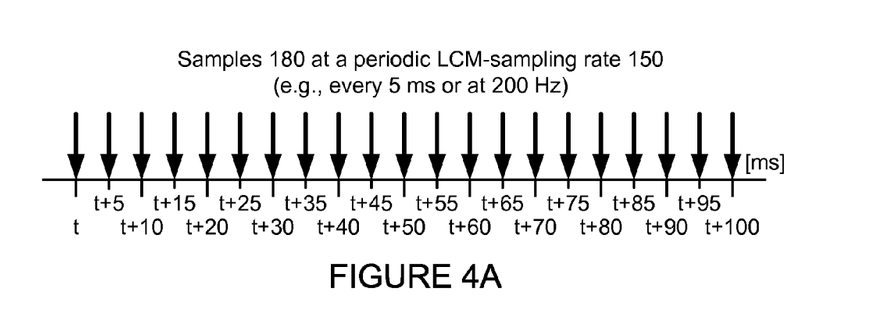
FIGS. 4A and 4B show an example a periodic sampling schedule for over sampling a sensor signal at a periodic over-sampling rate and a corresponding over-sampling triggering signal.
Figure 4B:
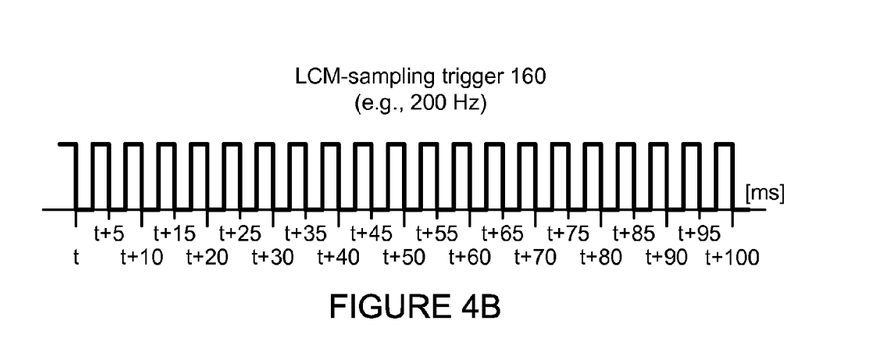

FIGS. 4A and 4B show an example of a periodic sampling schedule for over sampling a sensor signal at a periodic over-sampling rate and a corresponding over-sampling triggering signal. In FIG. 4A, samples 180 are taken at a rate much higher than either the first or second periodic sampling rates 51, 52. The periodic LCM-sampling rate 150 is selected to be equal to the LCM of the first and second periodic sampling rates 51 and 52. In the example provided, a sampler 40 operating at the periodic LCM-sampling rate 150 is produces samples 180 every 5 ms at times {t, t+5, t+10, t+15, t+20, . . . } or at a rate of 200 Hz. FIG. 4B shows a corresponding LCM-sampling trigger signal 160 with a negative edge every 5 ms resulting in a periodic triggering signal of 200 Hz.

The high rate of the periodic triggering signal 160 results in frequent data bit transition on bus 30 and a majority of the samples taken may never be used by any applications. For example, in the example described above: (1) 4 of every 20 samples are used just by the first application 1001; (2) 3 of every 20 samples are used just by the second application 1002; and (3) 1 of every 20 samples is used by the first and second applications 1001, 1002. As a result, the remaining 12 of 20 samples are discarded. These unnecessary samples consumed power to produce at the sampler 40 and consumed power at the bus 80 for data transitions.

Embodiments of the present invention reduce the power otherwise consumed by reducing a number of total samples taken and, as a result, reducing a number of total bus transitions.

Figure 5A:
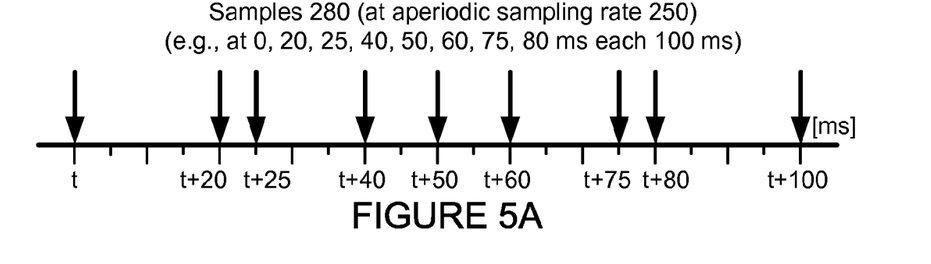
FIGS. 5A and 5B show an example of an aperiodic sampling schedule for sampling a sensor signal at an aperiodic sampling rate and a corresponding aperiodic triggering signal, in accordance with some embodiments of the present invention.
Figure 5B:
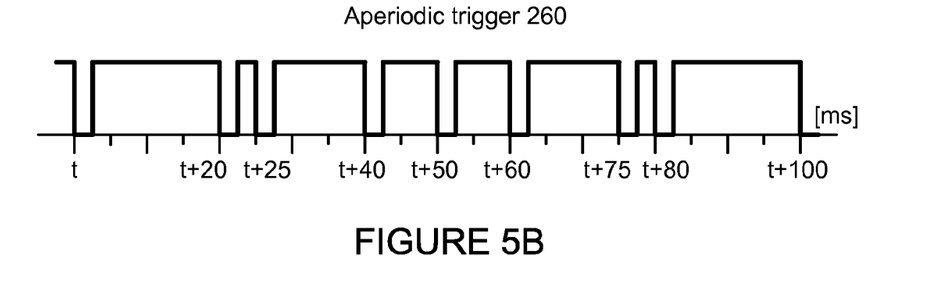

FIGS. 5A and 5B show an example of an aperiodic sampling schedule for sampling a sensor signal at an aperiodic sampling rate and a corresponding aperiodic triggering signal, in accordance with some embodiments of the present invention.

In FIG. 5A, samples are shown at times needed by at least one of the applications. The first and second applications 1001, 1002 require samples at a first sampling rate 51 and second sampling rate 52. The sampler 40 produces samples 280 just when at least one of the two applications requires a sample. As a result, the samples 280 occur at an aperiodic sampling rate 250. Unnecessary samples are not taken by sampler 40. For example, if the first and second periodic sampling rates 51 and 52 are 50 Hz and 40 Hz, respectfully, the samples will occur at times {t, t+20, t+25, t+40, t+50, t+60, t+75, t+80, t+100, . . . }. An aperiodic sampling rate 250 is derived from multiple periodic sample rates. For example, a first periodic sampling rate may be N times a base rate and a second periodic sampling rate may be M times the base rate, where N and M are different positive integers. In addition, in some cases, the ratios of N to M and M to N are both non-integers. Also, in some cases, the N and M are both greater than one. Based on the periodic sampling rates, the resulting periodic subsets of samples may overlap (i.e., have some common samples).

FIG. 5B shows a corresponding aperiodic trigger signal 260, which occurs at a time corresponding to when each sample is needed. The aperiodic trigger signal 260 is used by the sampler 40 to trigger each raw sample.

In some embodiments, a timer is used to generate the aperiodic triggering signal 260. For the example shown and considering time t as the current time, a timer may be set to expire after a first duration ($D_1 = |(t+20)-t|$). Based on the timer expiring after the first duration of time at time t+20, a transition is provided on the aperiodic triggering signal 260 and the timer is reset to expire after a second duration ($D_2 = |(t+25)-(t+20)|$). The timer next expires after the second duration of time at time t+25. Based on the timer expiring after the second duration, another transition is provided on the aperiodic triggering signal 260 and the timer is reset to expire after a third duration ($D_3 = |(t+40)-(t+25)|$). For an aperiodic sampling rate, the first, second and third durations are not necessarily equal. In this example, the first duration is 20 ms, the second duration is 5 ms and the third duration is 15 ms. For periodic samples, the duration between successive samples is a constant time.

Figure 6:
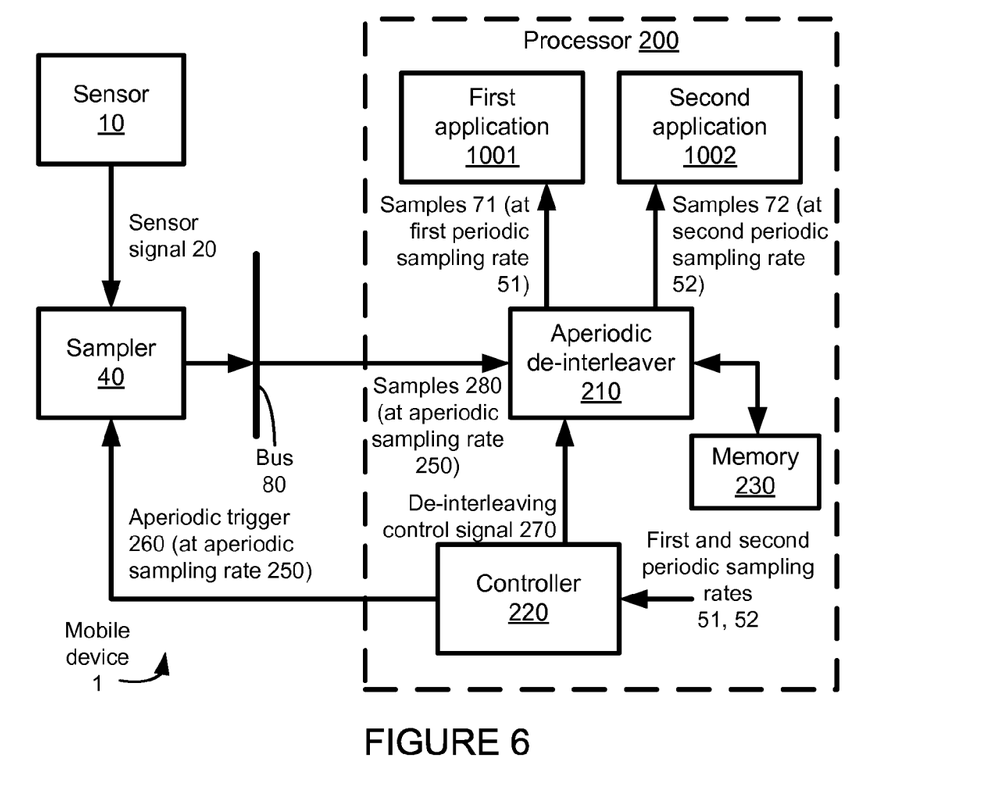
FIG. 6 illustrates a mobile device for providing a sensor signal to multiple applications, each requiring a different sampling rate, in accordance with some embodiments of the present invention.

FIG. 6 illustrates a mobile device for providing a sensor signal to multiple applications, each requiring a different sampling rate, in accordance with some embodiments of the present invention. It is understood that some embodiments will have at least two applications that require the same sampling rate, while another application requires a different sampling rate. The mobile device 1 includes a sensor 10, a sampler 40, a processor 200 and a bus 80 coupling the sampler to the processor 200. The processor 200 includes memory 230, a controller 220, an aperiodic de-interleaver 210 and first and second applications 1001, 1002. The controller 220, an aperiodic de-interleaver 210 and applications may each be modules running on the processor 200. Each module may be software to perform the functions of the module. The sensor 10 provides an analog sensor signal 20 to the sampler 40. The sampler 40 includes an input port to couple to the sensor signal 20, a control port to couple to an aperiodic triggering signal 260, which is based on an aperiodic sampling rate 250, and an output port to provide aperiodic samples 280 at the aperiodic sampling rate 250. Based on timing provided by an aperiodic triggering signal 260, which provides negative transitions at an aperiodic sampling rate 250, the sampler 40 provides samples 280 to the processor 200 via a bus 80. The sampler 40 acts as a means for sampling the sensor signal 20 at an aperiodic sampling rate 250 resulting in aperiodic samples 280.

As noted above, excessive bus transitions consume significantly more power with high rate periodic sampling. Using the lower rate aperiodic sampling, consumption of power on the bus is greatly reduced. The samples 280 are digitized versions of the analog sensor signal 20 at the transitions supplied by the aperiodic triggering signal 260. The aperiodic de-interleaver 210 copies the incoming samples 280 for use by the separate applications 1001, 1002. The aperiodic de-interleaver 210 acts as a means for de-interleaving. The aperiodic de-interleaver 210 includes an input port to couple to the aperiodic samples 280, a first output port to route to a first application 1001 a first subset of the aperiodic samples 71 at a first periodic sampling rate 51, and a second output port to route to a second application 1002 a second subset of the aperiodic samples 72 at a second periodic sampling rate 52. A combination of all of the subsets of periodic samples results in the aperiodic samples 280. As noted above, the first and second periodic sample rates are different. The aperiodic de-interleaver 210 may also include a first control port to couple to the first periodic sampling rate and a second control port to couple to the second periodic sampling rate. The first and second periodic sampling rates may be represented by the de-interleaving control signal 270.

The aperiodic de-interleaver 210 may use memory 230 to store or buffer samples 280 in one buffer or a buffer corresponding to each application. In this manner, each sample 280 entering the aperiodic de-interleaver 210 is supplied to one or more of the applications. For example, a first sample 280 is provided to both the first and second applications 1001, 1002 as sample 71 to the first application 1001 and as sample 72 to the second application 1002. A second sample 280 is provided to just the first application 1001 as sample 71. A third sample 280 is provided to just the second application 1002 as sample 72. Thus, the first application 1001 receives samples 71 at the first periodic sampling rate 51 and the second application 1002 receives samples 72 at the second periodic sampling rate 52. Therefore, depending on timing, each particular sample from the aperiodic samples 280 will be either: (1) forwarded to just a single application; or (2) forwarded to two or more applications. No samples 280 are discarded. As such, each sample 280 is provided to at least one application.

Control for determining which one or more applications receive a particular sample 280 is determined by a de-interleaving control signal 270 generated by the controller 220. The de-interleaving control signal 270 may be a separate control signal for each application, which indicates whether a particular sample 280 will be passed to a particular application represented by that control signal. Alternatively, the de-interleaving control signal 270 may be a schedule, which the aperiodic de-interleaver 210 interprets to determine routing of incoming samples 280.

The controller 220 sets the de-interleaving control signal 270 and the aperiodic triggering signal 260 based on the required periodic sampling rates. For example, a first and second periodic sampling rates 51, 52 are provided to the controller 220. The controller 220 determines a sampling schedule based on these required periodic rates. Depending on the applications' requirements, a multiple of one rate may equal the other rate. In these cases, a periodic sampling rate equal to the larger of the two rates is used. In some cases, applications may require two different periodic sampling rates such that a multiple N of first required periodic sampling rate equals a multiple M of a second required periodic sampling rate (i.e., $N*R_1=M*R_2$, where $R_1$ is a first periodic sampling rate and R2 is a first periodic sampling rate), where N and M are unequal, positive integers greater than one. In these cases, the de-interleaver 210 will periodically supply a common sample 280 to both applications during the course of de-interleaving the samples. In some cases, a first periodic sampling rate is N times a base rate and the second periodic sampling rate is M times the base rate, wherein N and M are positive integers and wherein ratios of N to M and M to N are both non-integers. In cases where N and M are unequal, positive integers greater than one, samples 71 and samples 72 are overlapping subsets. In each case, samples 71 and samples 72 combine to form a set of samples represented by samples 280.

Figure 7:
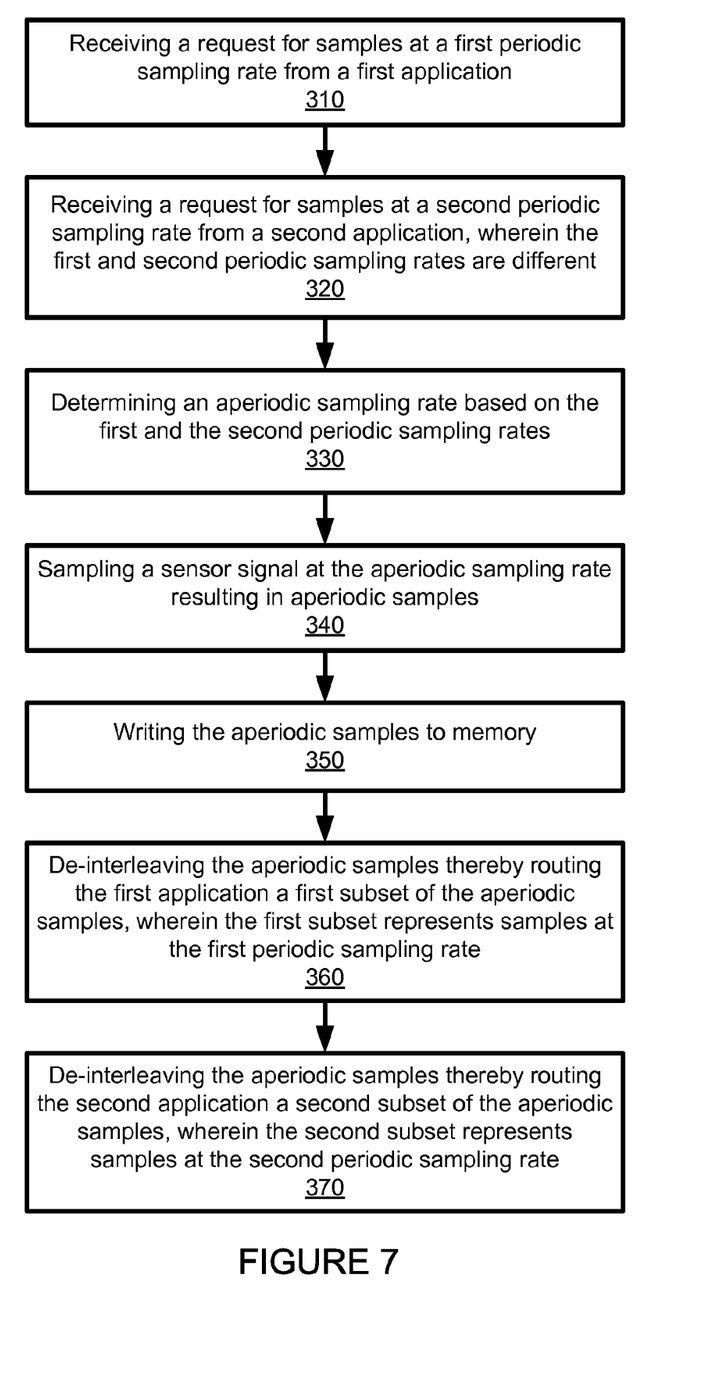
FIG. 7 diagrams a flowchart of a mobile device for providing a sensor signal to multiple applications, each requiring a different sampling rate, in accordance with some embodiments of the present invention.

FIG. 7 diagrams a flowchart of a mobile device for providing a sensor signal to multiple applications, each requiring a different sampling rate, in accordance with some embodiments of the present invention.

At 310, the mobile device 1 receives a request for samples 71 at a first periodic sampling rate 51 from a first application 1001. At 320, the mobile device 1 receives a request for samples 72 at a second periodic sampling rate 52 from a second application 1002, wherein the first and second periodic sampling rates are different. The first and second application 1001, 1002 may reside within mobile device 1 as code executing on the processor 200.

At 330, the mobile device 1 determines an aperiodic sampling rate 250 based on the first and the second periodic sampling rates 51, 52. This flowchart may be expanded with a third application requiring a third periodic sampling rate. The mobile device 1 could receive a request for samples at a third periodic sampling rate from a third application. Then at 330, the mobile device 1 determines an aperiodic sampling rate 250 based on the three periodic sampling rates.

At 340, the mobile device 1 samples a sensor signal 20 at the aperiodic sampling rate 250 resulting in aperiodic samples 280. At 350, the mobile device 1 writes the aperiodic samples to memory 230. The memory 230 may be a single input register on the processor 200, a pair of memory locations, one memory location for each application, a buffer for incoming samples, or a buffer for each application.

At 360 and 370, the mobile device 1 de-interleaves the aperiodic samples for the first and second applications 1001, 1002, thereby routing the first application 1001 a first subset of the aperiodic samples 71 and routing the second application 1002 a second subset of the aperiodic samples 72. The first subset 71 represents samples at the first periodic sampling rate 51. Similarly, the second subset 72 represents samples at the second periodic sampling rate 52. In the case of one or more additional applications, the act of de-interleaving the aperiodic samples 280 further comprises routing to the third application a third subset of the aperiodic samples, wherein the third subset represents samples at the third periodic sampling rate.

Figure 8:
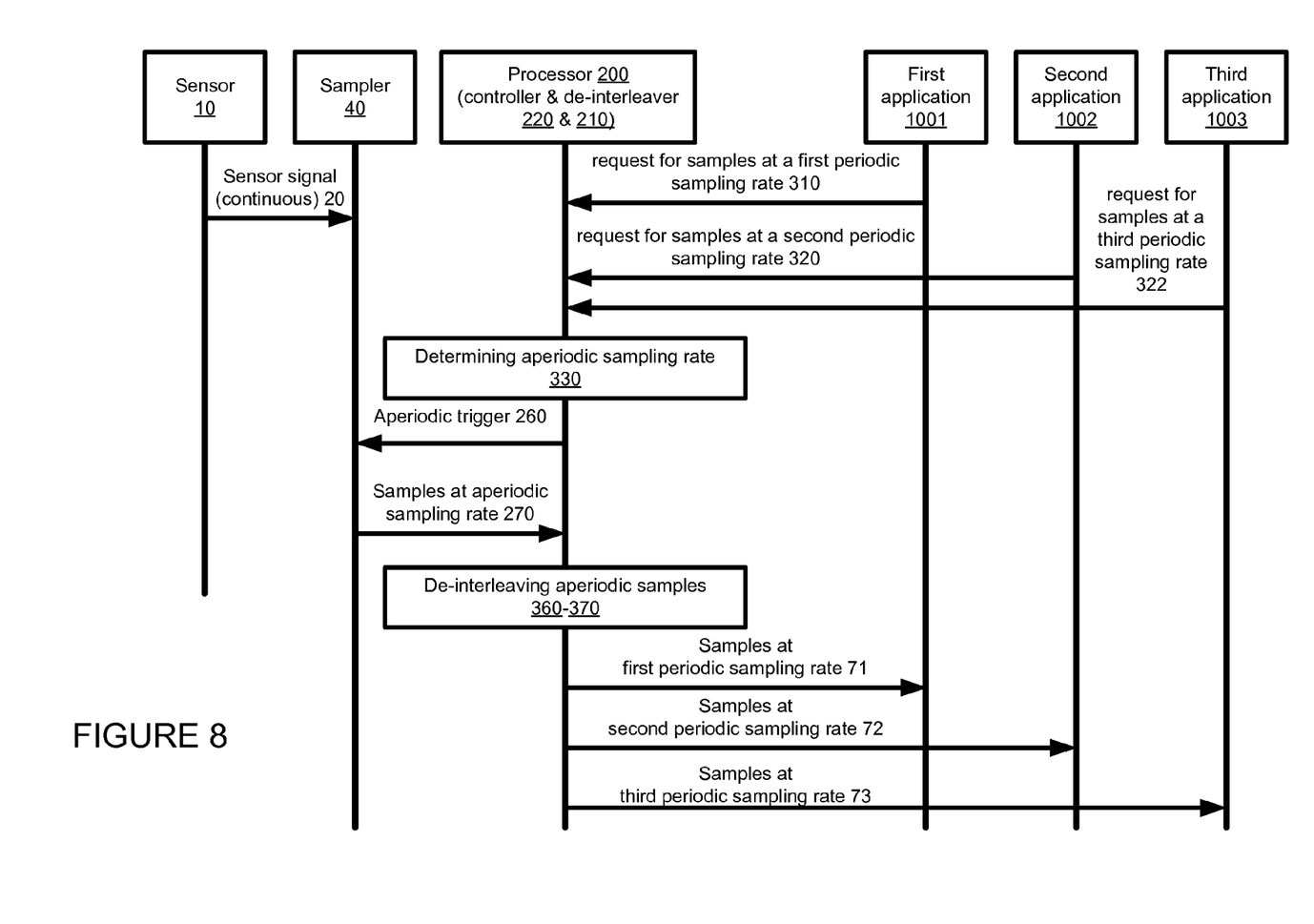
FIG. 8 shows a messaging diagram of a mobile device for providing a sensor signal to multiple applications, each requiring a different sampling rate, in accordance with some embodiments of the present invention.

FIG. 8 shows a messaging diagram of a mobile device for providing a sensor signal to multiple applications, each requiring a different sampling rate, in accordance with some embodiments of the present invention. The mobile device includes a sensor 10, a sampler 40, and processor 200 with a controller 220 and de-interleaver 210 running a first, second and third applications 1001, 1002, 1003. The sensor 10 provides an analog sensor signal 20 to a sampler 40.

At 310, the first application 1001 sends a request for samples 71 at a first periodic sampling rate 51. At 320, the second application 1002 sends a request for samples 72 at a second periodic sampling rate 52. At 322, the third application 1003 sends a request for samples 73 at a third periodic sampling rate 53. The request are received by a controller module 220 in the processor 200 and may arrive in or out of order and at scheduled times. The requests may be initiated by the applications and pushed to the controller 220, or may be pulled from the applications by the controller 220.

At 330 and based on requested sampling rates received so far (e.g., the second and third rates have been requested but the first rate request has not been received yet), the controller 220 determines an aperiodic sampling rate 250 and generates an aperiodic triggering signal 260 based on the determined aperiodic sampling rate 250 to the sampler 40. The aperiodic triggering signal 260 may be a pulsed signal (as shown in FIG. 5B) or may be in the form of digital control commands. The controller 220 updates this aperiodic triggering signal 260 as additional requests for a new sampling rate are received and as requests for old sampling rates expire.

The sampler 40 receives the aperiodic triggering signal 260 and the analog sensor signal 20 continuously generated by the sensor 10 while the sensor 10 is in an activated mode. At 270 and in response to the aperiodic triggering signal 260, the sampler 40 returns samples 280 at the aperiodic sampling rate 250. This process continues until the aperiodic triggering signal 260 updates to a new aperiodic sampling rate or terminates sampling.

At 360 and 370, the aperiodic de-interleaver 210 de-interleaves the received aperiodic samples 280. The aperiodic de-interleaver 210 receives stream of aperiodic samples 280 and routes or parses out periodic streams of samples (e.g., periodic samples 71 at the first sampling rate 51 for the first application 1001, periodic samples 72 at the second sampling rate 52 for the second application 1002, and periodic samples 73 at the third sampling rate 53 for the third application 1003).

Figure 9:
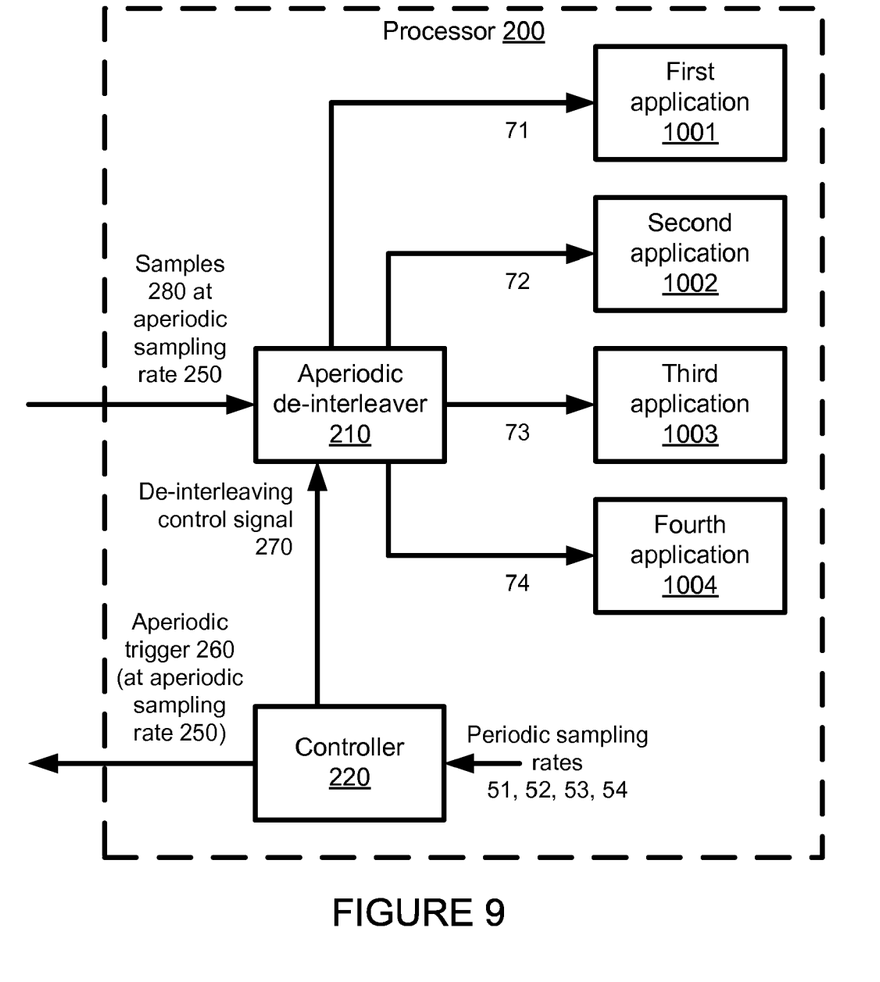
FIG. 9 illustrates a processor in a mobile device for providing a sensor signal to multiple applications, each requiring a different sampling rate, in accordance with some embodiments of the present invention.

FIG. 9 illustrates a processor in a mobile device for providing a sensor signal to multiple applications, each requiring a different sampling rate, in accordance with some embodiments of the present invention. The mobile device includes a processor 200 with an aperiodic de-interleaver 210, a controller 220 and a first, second, third and fourth applications 1001, 1002, 1003, 1004. The controller 220 receives a respective four periodic sampling rates 51, 52, 53, 54, determines an aperiodic sampling rate 250 based on the four periodic sampling rates 51, 52, 53, 54, generates an aperiodic triggering signal 260 for the sampler 40 based on the aperiodic sampling rate 250, and generates a de-interleaving control signal 270 also based on the aperiodic sampling rate 250. The aperiodic de-interleaver 210 routes or parses the incoming samples 280 each to the appropriate one or more applications 1001, 1002, 1003, 1004, based on the de-interleaving control signal 270 to create the respective periodic sample streams 71, 72, 73, 74.

Figure 10:
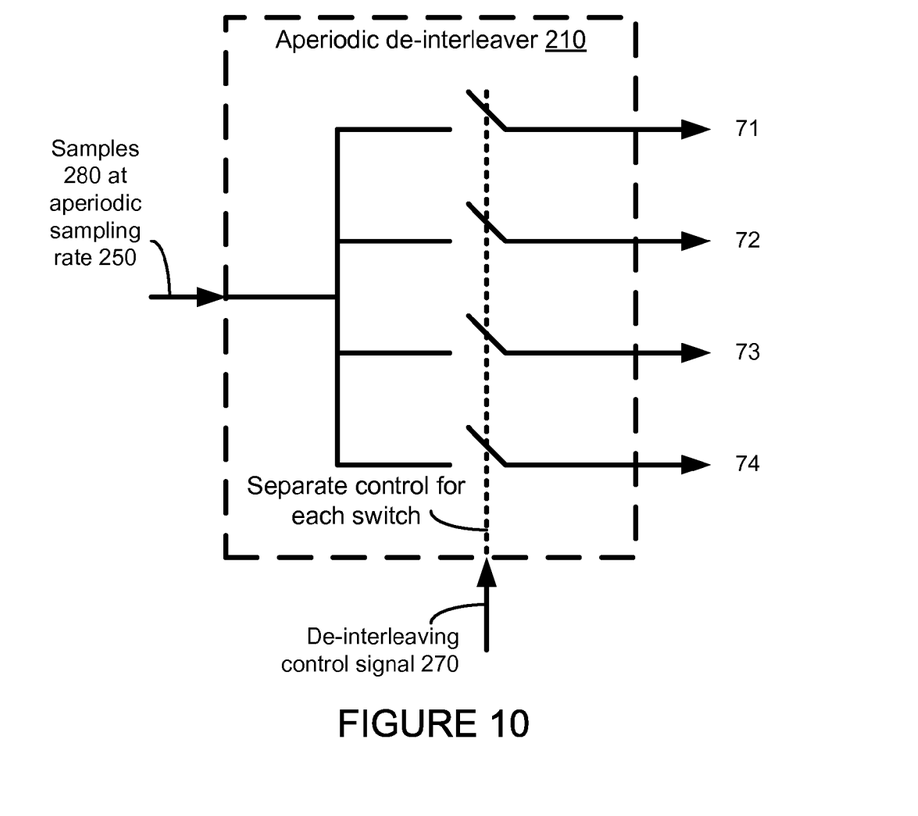
FIG. 10 shows an aperiodic de-interleaver, in accordance with some embodiments of the present invention.

FIG. 10 shows an aperiodic de-interleaver, in accordance with some embodiments of the present invention. The aperiodic de-interleaver 210 includes one switch for each output stream 71, 72, 73, 74. The switches act as a means for routing or parsing subsets of the aperiodic samples to the respective applications. Each switch is controlled by a separate control derived from the de-interleaving control signal 270. For example, a first switch couples the aperiodic samples 280 to the periodic sample stream 71. The switch may be implemented in hardware or software. If in software, the aperiodic de-interleaver 210 copies an incoming sample from the aperiodic samples 280 to a memory location such that the first application may receive the sample as the next sample in the periodic samples 71.

Figure 11:
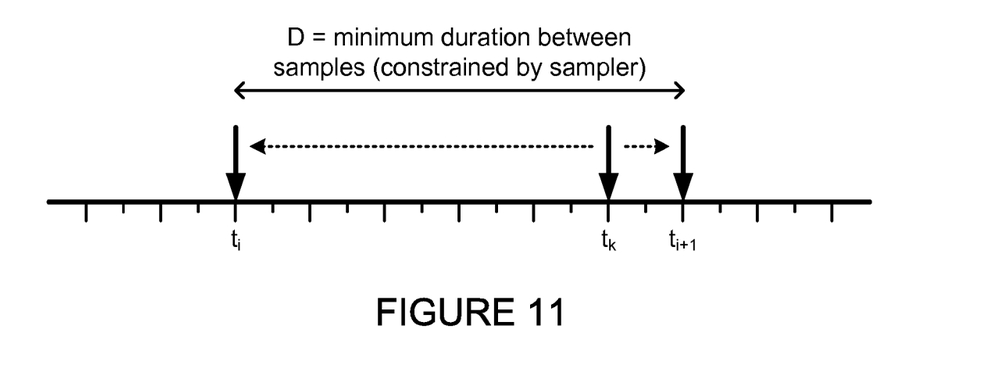
FIG. 11 illustrates a timing diagram showing a minimum duration between samples, in accordance with some embodiments of the present invention.

FIG. 11 illustrates a timing diagram showing a minimum duration between samples, in accordance with some embodiments of the present invention. Often a sampler requires a minimum duration 'D' between samples, which is usually represented by a maximum sampling frequency 1/D in Hertz. In these cases, the controller 220 or sampler 40 may delay the triggering time to comply with the minimum spacing. For example, if the last sample was taken at time t, and the next sample is scheduled to be taken as $t_k$ but $|t_i-t_k|<D$, the controller 220 may shift the next time to occur at time $t_{i+1}$, where $|t_i-t_{i+1}|=D$. Alternatively, the controller 220 or sampler 40 may advance the triggering time to avoid the minimum spacing issue. For example, if the last sample was taken at time t, and the next sample is scheduled to be taken as $t_k$ but $|t_i-t_k|<D$, the controller 220 or sampler 40 may skip sampling at time $t_k$ (or time $t_{i+1}$) and use the sample at time t, to represent a sample at time $t_k$. Alternatively, the controller 220 or sampler 40 may advance or delay the triggering time. For example, if the last sample was taken at time t, and the next sample is scheduled to be taken as $t_k$ and if $|t_i-t_k|<D/2$, the controller 220 may skip sampling at time $t_k$ (or time $t_{i+1}$) and use the sample at time $t_i$ to represent a sample at time $t_k$. If $D/2<|t_i-t_k|<D$, the controller 220 or sampler 40 may shift the next time to occur at time $t_{i+1}$, where $|t_i-t_{i+1}|=D$.

As indicated, the above-described modules may be implemented individually or in combination as software instructions. These software instructions may be saved as program code on a computer-readable medium for later execution on a processor 200. Furthermore, a mobile device 1 may include a processor 200 and memory 230, wherein the memory 230 includes these software instructions to execute one or more of these modules.

The previous description of the disclosed aspects is provided to enable any person skilled in the art to make or use the present disclosure. Various modifications to these aspects will be readily apparent to those skilled in the art, and the generic principles defined herein may be applied to other aspects without departing from the spirit or scope of the disclosure.

The invention claimed is:

1. A method of providing a sensor signal to multiple applications in a mobile device, each requiring a different sampling rate, the method comprising:
   sampling the sensor signal at an aperiodic sampling rate resulting in aperiodic samples; and
   de-interleaving the aperiodic samples comprising
      routing to a first application a first subset of the aperiodic samples, wherein the first subset represents samples at a first periodic sampling rate; and
      routing to a second application a second subset of the aperiodic samples, wherein the second subset represents samples at a second periodic sampling rate, and wherein the first periodic sample rate differs from the second periodic sampling rate.

2. The method of claim 1, wherein the first periodic sampling rate is N times a base rate and the second periodic sampling rate is M times the base rate, wherein N and M are positive integers and wherein ratios of N to M and M to N are both non-integers.

3. The method of claim 1, further comprising:
   receiving a first request for samples at the first periodic sampling rate from the first application; and
   receiving a second request for samples at the second periodic sampling rate from the second application.

4. The method of claim 1, further comprising:
   writing the aperiodic samples to memory;
   wherein the act of de-interleaving the aperiodic samples further comprises reading the aperiodic samples from the memory.

5. The method of claim 1, wherein the first and second subsets comprise overlapping samples.

6. The method of claim 1, further comprising determining the aperiodic sampling rate based on the first periodic sampling rate and the second periodic sampling rate.

7. The method of claim 1, further comprising:
receiving a third request for samples at a third periodic sampling rate from a third application, wherein the third periodic sampling rate is different from the first and second sample rates; and
determining the aperiodic sampling rate based on the first, second and third periodic sampling rates;
wherein the act of de-interleaving the aperiodic samples further comprises routing to the third application a third subset of the aperiodic samples, wherein the third subset represents samples at the third periodic sampling rate.

8. The method of claim 1, further comprising:
setting a timer to expire after a first duration;
setting the time to expire after a second duration based on expiration of the first duration; and
setting the timer to expire after a third duration based on expiration of the second duration;
wherein the first and second durations comprise two different durations; and
wherein the first, second and third durations result from the first periodic sampling rate and the second periodic sampling rate.

9. A mobile device for providing a sensor signal to multiple applications in a mobile device, each requiring a different sampling rate, the device comprising:
a sampler comprising an input port to couple to the sensor signal, a control port to couple to an aperiodic trigger based on an aperiodic sampling rate, and an output port to provide aperiodic samples at the aperiodic sampling rate; and
a de-interleaver comprising an input port to couple to the aperiodic samples, a first output port to route to a first application a first subset of the aperiodic samples at a first periodic sampling rate, and a second output port to route to a second application a second subset of the aperiodic samples at a second periodic sampling rate;
wherein the first and second periodic sample rates are different.

10. The mobile device of claim 9, wherein the de-interleaver further comprises:
a first control port to couple to the first periodic sampling rate; and
a second control port to couple to the second periodic sampling rate.

11. The mobile device of claim 9, wherein the first periodic sampling rate is N times a base rate and the second periodic sampling rate is M times the base rate, wherein N and M are positive integers and wherein ratios of N to M and M to N are both non-integers.

12. The mobile device of claim 9, wherein the first and second subsets comprise overlapping samples.

13. The mobile device of claim 9, further comprising memory coupled to the sampler and to the de-interleaver and configured to hold the aperiodic samples.

14. The mobile device of claim 9, wherein the aperiodic sampling rate is based on the first periodic sampling rate and the second periodic sampling rate.

15. The mobile device of claim 9, wherein the de-interleaver further comprises:
a third output port to route to a third application a third subset of the aperiodic samples at a third periodic sampling rate;
wherein the first, second and third periodic sample rates are different.

16. A mobile device for providing a sensor signal to multiple applications in the mobile device, each requiring a different sampling rate, the device comprising:
means for sampling the sensor signal at an aperiodic sampling rate resulting in aperiodic samples; and
means for de-interleaving the aperiodic samples comprising
means for routing a first application a first subset of the aperiodic samples, wherein the first subset represents samples at a first periodic sampling rate; and
means for routing a second application a second subset of the aperiodic samples, wherein the second subset represents samples at a second periodic sampling rate, wherein the first periodic sample rate differs from the second periodic sampling rate.

17. A mobile device for providing a sensor signal to multiple applications in the mobile device, each requiring a different sampling rate, the device comprising a processor and a memory wherein the memory includes software instructions to:
instruct a sampler to sample the sensor signal at an aperiodic sampling rate resulting in aperiodic samples; and
de-interleave the aperiodic samples comprising software instructions to
route a first application a first subset of the aperiodic samples, wherein the first subset represents samples at a first periodic sampling rate; and
route a second application a second subset of the aperiodic samples, wherein the second subset represents samples at a second periodic sampling rate, wherein the first periodic sample rate differs from the second periodic sampling rate.

18. A non-transitory computer-readable storage medium including program code stored thereon, comprising program code to:
instruct a sampler to sample the sensor signal at an aperiodic sampling rate resulting in aperiodic samples; and
de-interleave the aperiodic samples comprising program code to
route a first application a first subset of the aperiodic samples, wherein the first subset represents samples at a first periodic sampling rate; and
route a second application a second subset of the aperiodic samples, wherein the second subset represents samples at a second periodic sampling rate, wherein the first periodic sample rate differs from the second periodic sampling rate.

* * * * *